(12) United States Patent  
Smirnov et al.

(10) Patent No.: US 9,500,789 B2
(45) Date of Patent: Nov. 22, 2016

(54) POLARIZER BASED ON A NANOWIRE GRID

(71) Applicants: Valery K. Smirnov, Yaroslavl (RU); Dmitry S. Kibalov, Yaroslavl (RU)

(72) Inventors: Valery K. Smirnov, Yaroslavl (RU); Dmitry S. Kibalov, Yaroslavl (RU)

(73) Assignee: Wostec, Inc., San Francisco, CA (US)

( * ) Notice: Subject to any disclaimer, the term of this patent is extended or adjusted under 35 U.S.C. 154(b) by 0 days.

(21) Appl. No.: 14/775,658

(22) PCT Filed: Mar. 13, 2013

(86) PCT No.: PCT/RU2013/000192
§ 371 (c)(1),
(2) Date: Sep. 11, 2015

(87) PCT Pub. No.: WO2014/142700
PCT Pub. Date: Sep. 18, 2014

(65) Prior Publication Data
US 2016/0018579 A1  Jan. 21, 2016

(51) Int. Cl.
| | | |
|---|---|---|
| *B29D 11/00* | (2006.01) | |
| *G02B 5/30* | (2006.01) | |
| *B81C 1/00* | (2006.01) | |
| *H01J 37/32* | (2006.01) | |
| *B82Y 40/00* | (2011.01) | |
| *B82Y 20/00* | (2011.01) | |

(52) U.S. Cl.
CPC ......... *G02B 5/3058* (2013.01); *B81C 1/00031* (2013.01); *H01J 37/32009* (2013.01); *B82Y 20/00* (2013.01); *B82Y 40/00* (2013.01)

(58) Field of Classification Search
CPC ........... H01J 37/32009; H01J 37/3174; H01J 37/3175; B89C 1/00031; B89C 1/00055; B89C 1/00063; G02B 5/3058

USPC ............ 216/24, 26, 27, 62, 66, 41; 430/321, 430/322, 323, 324
See application file for complete search history.

(56) References Cited

U.S. PATENT DOCUMENTS

| | | | |
|---|---|---|---|
| 4,009,933 A | | 3/1977 | Firester |
| 4,072,541 A | | 2/1978 | Meulenberg et al. |
| 4,233,109 A | | 11/1980 | Nishizawa |
| 4,400,409 A | | 8/1983 | Izu et al. |
| 4,460,434 A | * | 7/1984 | Johnson ............ H01L 21/31055 204/192.34 |

(Continued)

FOREIGN PATENT DOCUMENTS

| | | |
|---|---|---|
| CN | 101486442 | 7/2009 |
| RU | 2141699 C1 | 11/1999 |

(Continued)

OTHER PUBLICATIONS

International Search Report and Written Opinion for International Patent Application No. PCT/RU2011/000489 mailed Mar. 1, 2012.

(Continued)

*Primary Examiner* — Lan Vinh
(74) *Attorney, Agent, or Firm* — Lowe Graham Jones PLLC; Bruce E. Black

(57) ABSTRACT

An array of nanowires with a period smaller then 150 nm can be used for applications such as an optical polarizer. A hard nanomask can be used to manufacture such structures. This nanomask includes a substantially periodic array of substantially parallel elongated elements having a wavelike cross-section. The fabrication method of the nanomask may be contactless and uses ion beams.

27 Claims, 5 Drawing Sheets

(56) References Cited

U.S. PATENT DOCUMENTS

| | | | |
|---|---|---|---|
| 4,857,080 A | 8/1989 | Baker et al. | |
| 5,160,618 A | 11/1992 | Burggraaf et al. | |
| 5,473,138 A | 12/1995 | Singh et al. | |
| 5,498,278 A | 3/1996 | Edlund | |
| 5,530,272 A | 6/1996 | Kudo et al. | |
| 5,578,379 A | 11/1996 | Stutzmann et al. | |
| 5,652,020 A | 7/1997 | Collins et al. | |
| 5,663,592 A * | 9/1997 | Miyazawa | B82Y 10/00 257/102 |
| 5,702,503 A | 12/1997 | Tse Tang | |
| 5,734,092 A | 3/1998 | Wang et al. | |
| 5,747,180 A | 5/1998 | Miller et al. | |
| 5,753,014 A | 5/1998 | Van Rijn | |
| 6,258,617 B1 | 7/2001 | Nitta et al. | |
| 6,274,007 B1 | 8/2001 | Smirnov et al. | |
| 6,417,939 B1 | 7/2002 | Laude | |
| 6,452,724 B1 | 9/2002 | Hansen et al. | |
| 6,518,194 B2 | 2/2003 | Winningham et al. | |
| 6,580,172 B2 | 6/2003 | Mancini et al. | |
| 6,667,240 B2 | 12/2003 | Ozaki et al. | |
| 6,706,576 B1 | 3/2004 | Ngo et al. | |
| 6,810,899 B2 | 11/2004 | Franz et al. | |
| 6,954,275 B2 | 10/2005 | Choi et al. | |
| 7,001,446 B2 | 2/2006 | Roark et al. | |
| 7,175,694 B2 | 2/2007 | Ma et al. | |
| 7,265,374 B2 | 9/2007 | Lee et al. | |
| 7,338,275 B2 | 3/2008 | Choi et al. | |
| 7,384,792 B1 | 6/2008 | Wang et al. | |
| 7,453,565 B2 | 11/2008 | Wang et al. | |
| 7,604,690 B2 | 10/2009 | Smirnov et al. | |
| 7,768,018 B2 | 8/2010 | Smirnov et al. | |
| 7,791,190 B2 | 9/2010 | Flores et al. | |
| 7,977,252 B2 | 7/2011 | Smirnov et al. | |
| 8,033,706 B1 | 10/2011 | Kelly et al. | |
| 8,426,320 B2 | 4/2013 | Smirnov et al. | |
| 8,859,440 B2 | 10/2014 | Smirnov et al. | |
| 8,859,888 B2 | 10/2014 | Smirnov et al. | |
| 2002/0074307 A1 | 6/2002 | Cotteverte et al. | |
| 2002/0142704 A1 | 10/2002 | Hu et al. | |
| 2002/0154403 A1 | 10/2002 | Trotter | |
| 2002/0170497 A1 | 11/2002 | Smirnov et al. | |
| 2003/0152787 A1 | 8/2003 | Arakawa et al. | |
| 2003/0171076 A1 | 9/2003 | Moloney et al. | |
| 2003/0183270 A1 | 10/2003 | Falk et al. | |
| 2003/0218744 A1 | 11/2003 | Shalaev et al. | |
| 2004/0070829 A1 | 4/2004 | Kurtz et al. | |
| 2004/0129135 A1 | 7/2004 | Roark et al. | |
| 2004/0174596 A1 | 9/2004 | Umeki | |
| 2004/0190116 A1 | 9/2004 | Lezec et al. | |
| 2004/0201890 A1 | 10/2004 | Crosby | |
| 2004/0238851 A1 | 12/2004 | Flores et al. | |
| 2005/0046943 A1 | 3/2005 | Suganuma | |
| 2005/0130072 A1 * | 6/2005 | Koeda | G02B 5/1857 430/321 |
| 2006/0043400 A1 | 3/2006 | Erchak et al. | |
| 2006/0205875 A1 | 9/2006 | Cha et al. | |
| 2006/0210886 A1 * | 9/2006 | Mizuyama | G03F 1/144 430/5 |
| 2006/0230937 A1 | 10/2006 | Smirnov et al. | |
| 2006/0273067 A1 * | 12/2006 | Smirnov | G02B 5/3058 216/24 |
| 2007/0012355 A1 | 1/2007 | LoCascio et al. | |
| 2007/0082457 A1 | 4/2007 | Chou et al. | |
| 2007/0217008 A1 | 9/2007 | Wang et al. | |
| 2008/0072958 A1 | 3/2008 | Dutta | |
| 2008/0119034 A1 | 5/2008 | Smirnov et al. | |
| 2008/0128727 A1 | 6/2008 | Erchak et al. | |
| 2008/0135864 A1 | 6/2008 | David et al. | |
| 2008/0169479 A1 | 7/2008 | Xu et al. | |
| 2009/0118605 A1 | 5/2009 | Van Duyne et al. | |
| 2009/0162966 A1 | 6/2009 | Jawarani et al. | |
| 2009/0214885 A1 | 8/2009 | Her et al. | |
| 2010/0110551 A1 | 5/2010 | Lamansky et al. | |
| 2010/0171949 A1 | 7/2010 | Mazur et al. | |
| 2010/0195204 A1 | 8/2010 | Walker | |
| 2010/0276612 A1 | 11/2010 | Norwood et al. | |
| 2010/0300893 A1 | 12/2010 | Suh et al. | |
| 2011/0197959 A1 | 8/2011 | Catchpole et al. | |
| 2011/0232744 A1 | 9/2011 | Larsen et al. | |
| 2011/0248386 A1 | 10/2011 | Smirnov et al. | |
| 2012/0176766 A1 | 7/2012 | Natsumeda | |
| 2012/0195335 A1 | 8/2012 | Kalosha et al. | |
| 2012/0314189 A1 | 12/2012 | Natsumeda et al. | |
| 2013/0057938 A1 | 3/2013 | Natsumeda et al. | |
| 2014/0151715 A1 | 6/2014 | Smirnov et al. | |
| 2014/0352779 A1 | 12/2014 | Smirnov et al. | |
| 2015/0042988 A1 | 2/2015 | Smirnov et al. | |

FOREIGN PATENT DOCUMENTS

| | | |
|---|---|---|
| RU | 2152108 C1 | 6/2000 |
| RU | 2173003 C2 | 8/2001 |
| RU | 2180885 C1 | 3/2002 |
| RU | 2204179 C1 | 5/2003 |
| RU | 2231171 C1 | 6/2004 |
| RU | 2240280 C1 | 11/2004 |
| RU | 2321101 C1 | 3/2008 |
| TW | 200939471 A | 9/2009 |
| WO | 0017094 | 3/2000 |
| WO | 03032398 | 4/2003 |
| WO | 2005050697 A2 | 6/2005 |
| WO | 2010072862 | 7/2010 |
| WO | 2011044687 | 4/2011 |
| WO | 2012009467 | 1/2012 |

OTHER PUBLICATIONS

International Search Report and Written Opinion for International Patent Application No. PCT/RU2011/000631 mailed Mar. 1, 2012.
International Search Report and Written Opinion for International Patent Application No. PCT/RU2011/00594 mailed Apr. 19, 2012.
International Search Report and Written Opinion for International Patent Application No. PCT/US2006/011420 mailed Jun. 26, 2008.
International Search Report and Written Opinion for International Patent Application No. PCT/US2006/021564 mailed Jul. 28, 2008.
Karen, A. et al., "Quantitative Investigation of the O2+-Induved Topography of GaAs and other III-V Semiconductors: an STM Study of the Ripple Formation and Suppression of the Secondary Ion Yield Change by Sample Rotation," Surface and Interface Analysis, vol. 23, 1995, pp. 506-513.
Scott, K.L. et al., "Pattern Generators and Microcolumns for Ion Beam Lithography," Journal of Vacuum Science Technology B, 18(6) 2000, pp. 3172-3176.
Vajo, J.J. et al., "Influence of O2+ Energy, Flux, and Fluence on the Formation and Growth of Sputtering-Induced Ripple Topography on Silicon," Journal of Vacuum Science and Tecnology A. 14(5), 1996, pp. 2709-2720.
Official Communication for U.S. Appl. No. 11/421,384 mailed Aug. 21, 2008.
Official Communication for U.S. Appl. No. 11/421,384 mailed Apr. 24, 2009.
Official Communication for U.S. Appl. No. 11/421,384 mailed Sep. 3, 2009.
Official Communication for U.S. Appl. No. 13/164,387 mailed Sep. 6, 2012.
Official Communication for U.S. Appl. No. 13/407,615 mailed Mar. 28, 2014.
European Search Report for European Application No. 06851545.1 mailed Feb. 8, 2010.
Official Communication for U.S. Appl. No. 13/859,442 mailed Oct. 18, 2013.
Official Communication for U.S. Appl. No. 13/859,442 mailed May 2, 2014.
Official Communication for U.S. Appl. No. 13/859,442 mailed Mar. 27, 2014.
Official Communication for U.S. Appl. No. 11/100,175 mailed Oct. 24, 2007.
Official Communication for U.S. Appl. No. 11/100,175 mailed May 16, 2008.

(56) References Cited

OTHER PUBLICATIONS

Official Communication for U.S. Appl. No. 11/100,175 mailed Feb. 9, 2009.
Chapter 7 in the book Sputtering by Particle Bombardment II: Sputtering of Alloys and Compounds, Electron and Neuron Sputtering, Surface Topography, Edited by R. Behrisch, 1983, Springer-Verlag, Berlin-Heidelberg-New York-Tokyo.
Mishra et al. Effect of initial target surface roughness on the evolution of ripple topography induced by oxygen sputtering of AI films, Journal of Applied Physics, vol. 105, 2009, 7 pages.
International Search Report and Written Opinion for PCT/RU2011/000977 mailed Sep. 6, 2012.
International Search Report and Written Opinion for PCT/RU2014/000458 mailed Feb. 5, 2015.
International Search Report and Written Opinion for PCT/RU2012/000016 mailed Sep. 13, 2012.
International Search Report and Written Opinion for PCT/RU2012/000210 mailed Dec. 20, 2012.
International Search Report and Written Opinion for PCT/RU2013/000192 mailed Dec. 5, 2013.
Supplementary European Search Report for EP Application No. 11870692.8 mailed Feb. 11, 2015.
Keller et al., "Optical and structural properties of GaN nanopillar and nanostripe arrays with embedded InGaN/GaN multiquantum wells", Journal of Applied Physics, 100 (2006): pp. 054314-1 to 054314-7.
Official Communication for U.S. Appl. No. 14/172,505 mailed Mar. 30, 2015.
Official Communication for U.S. Appl. No. 14/172,505 mailed Jun. 30, 2015.

\* cited by examiner

POLARIZER BASED ON A NANOWIRE GRID

CROSS-REFERENCE TO RELATED APPLICATIONS

This present application is a U.S. national stage application of PCT Application No. PCT/RU2013/000192, filed Mar. 13, 2013, which is hereby incorporated by reference in its entirety.

FIELD

The invention relates to non-lithographic methods for manufacturing devices, such as a polarizer, that have a grid of metal conductors located on the surface of a substrate. The invention also relates to methods and devices for forming periodic wire grids with a period of, for example, 150 nm or less.

BACKGROUND

Wire grid polarizers are widely used in, for example, devices for graphic information imaging (e.g., see U.S. Pat. No. 6,452,724, incorporated herein by reference). The commonly-used technology for manufacturing these devices is based on optical or interference lithography. However, the cost associated with the use of the tools designed for these applications is considered very significant. The existing approach and tools make it difficult to scale the production from smaller semiconductor wafer sizes to larger area substrates (such as glass or plastic sheets). In addition, the existing approach makes it is very difficult to create wire grid structures with a period of 150 nm or less. While different applications have different requirements, structures with smaller feature size are usually associated with higher performance.

A method for nanorelief formation on a film surface, utilizing plasma modification of a wave-ordered structure (WOS) formed on amorphous silicon layer, was disclosed in Russian Patent Application RU 2204179, incorporated herein by reference.

An example of this approach is schematically illustrated on FIGS. 1A and 1B. First, a layer of amorphous silicon 2 is deposited on top of the target thin film layer 4. Then, the silicon layer is sputtered with a flow of nitrogen ions 31 to create a conventional wave ordered nanostructure 1. The resultant wave-ordered nanostructure has relatively thick regions of amorphous silicon nitride 10 and relatively thin regions of amorphous silicon nitride 20 situated respectively on the front and back sides of the waves in the wave-ordered structure 1. As shown, the wave troughs are spaced from the surface of the film layer 4 by a distance D that is usually less than the nanostructure period 3. After the wave-ordered nanostructure 1 is formed, its planar pattern, which is shown in FIG. 1A, is transferred into the underlying film layer 4 by selectively etching the amorphous silicon layer 2 while using regions 10 and 20 as a nanomask.

However, experiments using conventional wave ordered nanostructures obtained by single-step oblique sputtering of amorphous silicon with nitrogen ions showed that these structures often do not possess a desired degree of ordering (i.e., high coherency). FIGS. 2A and 2B show an array of nanostructures 21 manufactured by this technique. The array is composed from amorphous silicon nanostripes 2 covered by the regions of amorphous silicon nitride 10. The nanostripes are separated by trenches 22. FIG. 2A shows that even in a relatively small area this array has a significant number of defects: bends, connections, and breaks. It may not be sufficiently coherent enough for optoelectronic applications.

A coherent hard nanomask and methods of its formation are described in U.S. Pat. No. 7,768,018 and U.S. Patent Application Publication No. 2006/0273067 and methods of formation of coherent wavy nanostructures are disclosed in U.S. Pat. No. 7,977,252 and U.S. Patent Application Publication No. 2008/0119034, all of which are incorporated herein by reference. However, in those methods the highest degree of the nanomask ordering is provided by oriented surface polishing in the first direction prior irradiating the surface with an ion beam. The step of oriented surface polishing has a contact nature, while it is preferable to use contactless methods to improve manufacturability and scaling of the nanomask over large areas.

A contactless method for improving the ordering of nanoscale ripple patterns is described in Adrian Keller and Stefan Facsko, Tuning the quality of nanoscale ripple patterns by sequential ion-beam sputtering, Physical Review B, Vol. 82, pp. 155444-(1-8), 2010, which is incorporated herein by reference. In this method, at the first step, the surface of monocrystalline silicon is obliquely irradiated with argon ions in a first plane of ion incidence to form a ripple pattern with ripples mostly elongated in a first direction which is perpendicular to the first plane. At the second step, the ripple pattern is irradiated at grazing angle with argon ions in a second plane of ion incidence which is perpendicular to the first plane and parallel to the first direction. The second step of ion irradiation results in improvement of ordering of the ripples formed at the first step due to 40% reduction in the density of the ripples' connections and breaks. However, in this method, the resultant ripples can hardly be used as a nanomask because, at the second step, most ripples are irradiated by ions from both sides simultaneously and symmetrically and, hence, both sides of such ripples are modified by ions equally. In addition, there is no considerable difference between the initial and the resultant ripple pattern quality and the attainable degree of the resultant ripple pattern ordering may not be sufficient for optoelectronic applications.

BRIEF SUMMARY

A variety of optoelectronic and other applications can benefit from the development of efficient methods for forming large arrays of nanowires with a period of 150 nm or less.

To manufacture such structures one embodiment of the present invention employs a hard nanomask formed by irradiating a layer of a first material with an ion flow. The hard nanomask is intended for use in transferring a substantially periodic pattern onto a thin film. This nanomask includes a substantially periodic array of substantially parallel elongated elements having a wavelike cross-section. At least some of the elements have the following cross-section: an inner region of first material, a first outer region of a second material covering a first portion of the inner region, and a second outer region of the second material covering a second portion of the inner region and connecting with the first outer region at a wave crest. The first outer region is substantially thicker than the second outer region. The second material is formed by modifying the first material using an ion flow. The substantially parallel, elongated elements having the wavelike cross-section are formed from a plurality of grooves by irradiating the grooves with the ion flow, where the grooves are oriented substantially parallel along the first direction and where the plane of incidence of the ion flow is substantially perpendicular to the first direction.

In at least some embodiments, the plurality of grooves is formed by polishing the surface of the first material in the first direction. The polishing can be performed using, for example, a slurry containing particles such as alumina particles, silica particles, chromium oxide particles, or any combination thereof. In at least some embodiments, the average particle size is not greater than a value approximately equal to the wavelength of the substantially periodic array.

In at least some other embodiments, the plurality of grooves is formed from a quasi-periodic, anisotropic array of elongated ridge elements having a wave-ordered structure pattern, each ridge element having a wavelike cross-section and oriented substantially in the first direction, by irradiating the array of elongated ridge elements with an ion flow, where the plane of incidence of the ion flow is substantially parallel to the first direction.

Another embodiment is a method of forming a hard nanomask for transferring a substantially periodic pattern into a thin film including depositing a first material to form a surface layer on top of a surface of a thin film; forming a plurality of grooves on the surface of the surface layer, wherein the grooves are oriented substantially parallel along a first direction; and irradiating the surface of the surface layer with the plurality of grooves with a flow of ions oriented substantially parallel along the first direction until a hard nanomask is formed, the nanomask including a substantially periodic array of substantially parallel elongated elements having a wavelike cross-section, at least some of the elements having the following structure in cross-section: an inner region of first material, a first outer region of a second material covering a first portion of the inner region, and a second outer region of the second material covering a second portion of the inner region and connecting with the first outer region at a wave crest, where the first outer region is substantially thicker than the second outer region, and where the second material is formed by modifying the first material by said ion flow, where the plane of ion incidence is substantially perpendicular to the first direction.

In at least some embodiments, forming a plurality of grooves on the surface of the surface layer includes forming a quasi-periodic, anisotropic array of elongated ridge elements having a wave-ordered structure pattern, each ridge element having a wavelike cross-section and oriented substantially in the first direction; and irradiating the array of elongated ridge elements with an ion flow until the plurality of grooves is formed on the surface of the surface layer, wherein the plane of ion incidence is substantially parallel to the first direction.

In at least some other embodiments, forming a plurality of grooves on the surface of the surface layer includes polishing the surface of the first material in the first direction. The polishing is performed using a slurry containing particles such as alumina particles, silica particles, chromium oxide particles, or any combination thereof. In at least some embodiments, the particle size is not greater than a value approximately equal to the wavelength of the substantially periodic array.

DETAILED DESCRIPTION

Figure 1A:
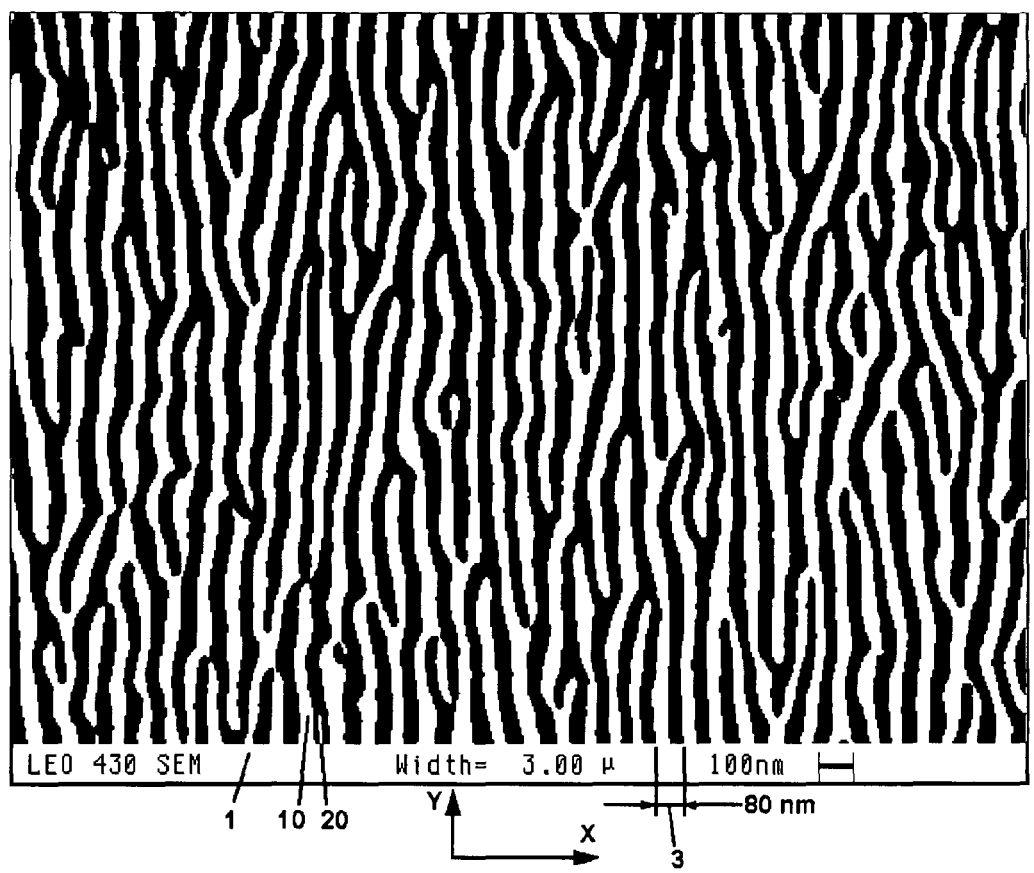
FIG. 1A shows a SEM top view image of a conventional WOS hard nanomask having a period of about 80 nm formed by single-step irradiation of amorphous silicon layer with $N_2^+$ ions having energy E=5 keV at the angle of bombardment θ=53° from surface normal.

Detailed descriptions of the preferred embodiments are provided herein. It is to be understood, however, that the present inventions may be embodied in various forms. Therefore, specific implementations disclosed herein are not to be interpreted as limiting.

A preliminary formation of elongated grooves oriented in a first direction may considerably increase the degree of WOS pattern ordering, i.e., its coherency, if during WOS formation the ion incidence plane is positioned substantially perpendicular to the first direction.

In at least some embodiments, an oriented polishing (a polishing of the surface in one preferred direction) in a direction of the wave crests of a wavelike nanostructure (WOS) to be formed is used as a preliminary step before the formation of the nanostructure, thereby, considerably increasing a degree of the pattern orientation (i.e. its coherency). In at least some embodiments, the oriented polishing in the first direction may result in the formation of elongated grooves oriented in the first direction.

For example, oriented polishing of silicon surface can be carried out using Ultra-Sol 7H™ colloidal silica manufactured by Eminess Technologies, Inc. This colloidal silica contains silica spherical particles of 70 nm in diameter. During the oriented polishing with the use of this colloidal silica, after removing an approximately 50-nm-thick layer of silicon, low-amplitude topographic waves having period of about 70 nm and peak-to-peak height of about 8 nm may be generated on the silicon surface. The wave shape in cross-section is similar to sinusoidal. The wave crests and troughs are substantially parallel to the direction of polishing. In this example, wave troughs may be considered as substantially parallel grooves.

A variety of water-based or toluene-based slurries containing small particles (such as alumina, silica, or chromium oxide or any combination thereof) can be used for the oriented polishing. For example, a number of suspension systems, similar to Ultra-Sol 7H™ can be used. This class of slurry systems is already used in a variety of industrial chemical-mechanical polishing (CMP) tools in semiconductor manufacturing.

In at least some embodiments, for oriented polishing the period of the resultant low-amplitude waves can be particle size dependent: polishing by smaller sized particles may often result in smaller periods of the low-amplitude topographic waves. In at least some embodiments, the size of the particles is not greater than the period (wavelength) of the substantially periodic array of elongated elements of the coherent hard nanomask.

Similar topographic waves can be generated by oriented polishing on the surface of different materials including, for example, monocrystalline silicon, amorphous silicon, silicon oxide, gallium arsenide, epitaxial gallium arsenide, gallium aluminum arsenide, epitaxial gallium aluminum arsenide, germanium, and silicon-germanium.

In at least some embodiments, the formation of elongated narrow grooves may be performed by ion sputtering of a conventional WOS at grazing angle in ion incidence plane substantially parallel to the wave crests of the conventional WOS.

Experiments on forming a wave-ordered structure (WOS) on a prior patterned silicon surface with narrow parallel grooves by oblique sputtering with nitrogen ions at an ion incidence plane substantially perpendicular to the grooves show that such WOS patterns often possess a considerably higher degree of ordering (i.e., high coherency) compared to conventional WOS patterns.

Figure 3:
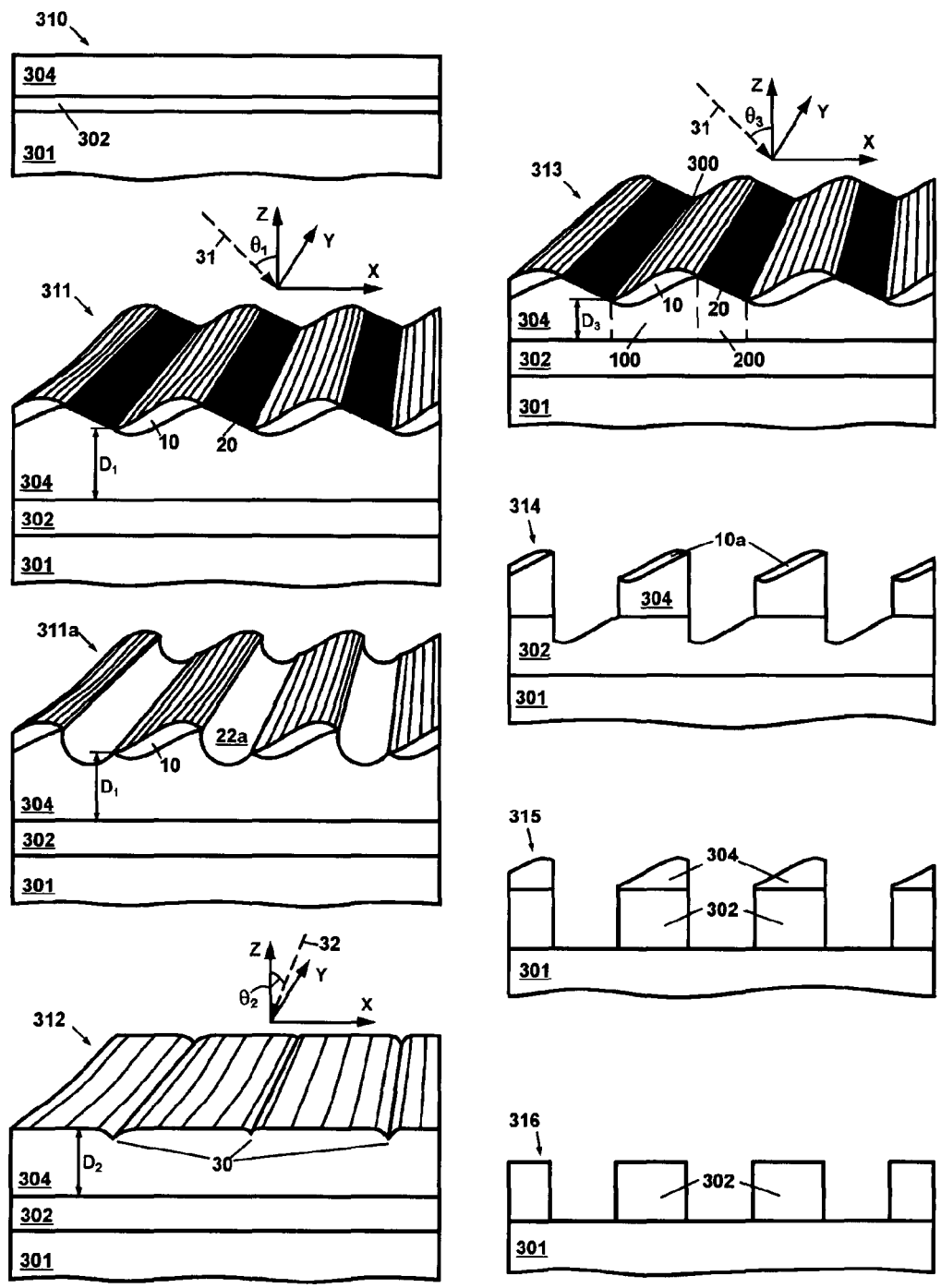
FIG. 3 schematically illustrates steps in one embodiment of a method for formation of a device, such as a wire grid polarizer, using a hard nanomask formed in amorphous silicon layer, according to the invention.

FIG. 3 illustrates one embodiment of a method to manufacture a wire grid polarizer or other device on a transparent glass substrate. It shows a structure 310, including a substrate (e.g., glass) 301, metal film 302, (for example aluminum, copper, silver, or other conductive metals, approximately 100-140 nm thick), and an amorphous silicon layer 304 (for example, approximately 270-430 nm thick).

The amorphous silicon layer 304 may be deposited, for example, by magnetron sputtering of a silicon target, by silicon target evaporation with an electron beam in high vacuum, or by any other method known in art. The thickness of the layer 304 is selected to enable the formation of a nanostructure with desired period, λ, (for example, a period of approximately 70-90 nm).

A conventional WOS is formed on the surface of layer 304, which results in the structure 311. In this example, the conventional WOS is formed using an oblique ion flow 31 of nitrogen $N_2^+$ ions positioned at the ion incidence plane XZ (the plane which is defined by a normal to the surface of the material and a vector oriented in the direction of the ion flow) at angle $\theta_1$ to the surface normal (Z-axis). In this particular example, to achieve a WOS period (wavelength) approximately equal to 80 nm the nitrogen ion bombardment angle $\theta_1$ is approximately equal to 53° and the ion energy is approximately equal to 5 keV. The WOS formation depth $D_F$ is approximately equal to 110 nm. The thick silicon nitride regions 10 and thin silicon nitride regions 20 on the opposite slopes of the waves are mostly elongated in the Y-axis direction. The top view of this conventional WOS pattern is similar to that shown in FIG. 1A. As shown in the structure 311, the wave troughs are spaced from the surface of the film layer 304 by a distance $D_1$, which may range from, for example, 140 to 290 nm.

In at least some embodiments, the structure 311 may be optionally wet-etched to form the structure 311a having nanotrenches 22 in place of regions 20. This optional wet etching may improve the ordering of resultant WOS nanomask.

Figure 1B:
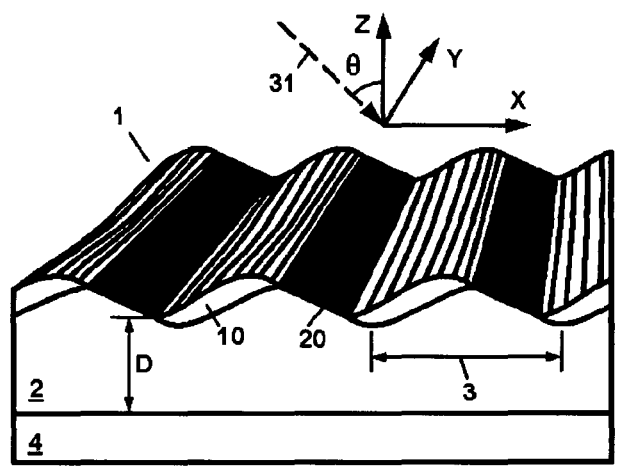
FIG. 1B is a perspective view of elongated ridge elements of a conventional WOS hard nanomask and their wavelike cross-section.
Figure 2A:
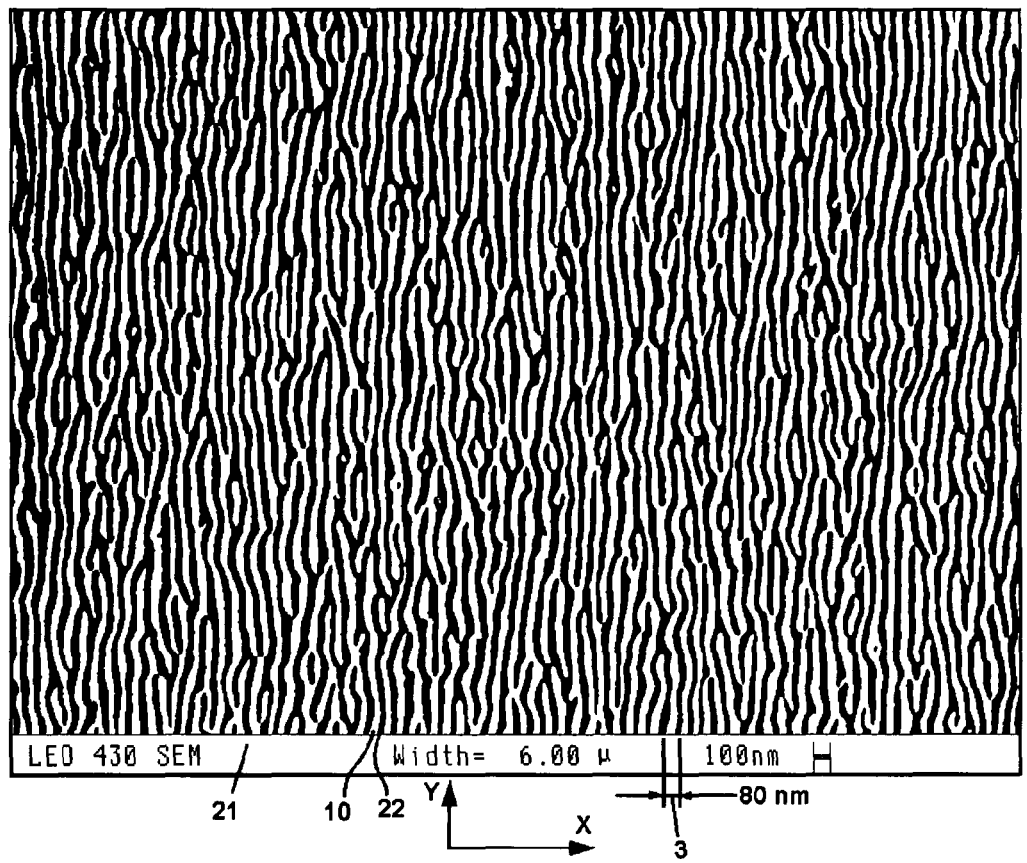
FIG. 2A shows a SEM top view image of one embodiment of an anisotropic array of elongated ridge elements formed in amorphous silicon layer from a conventional WOS hard nanomask by wet etching.
Figure 2B:
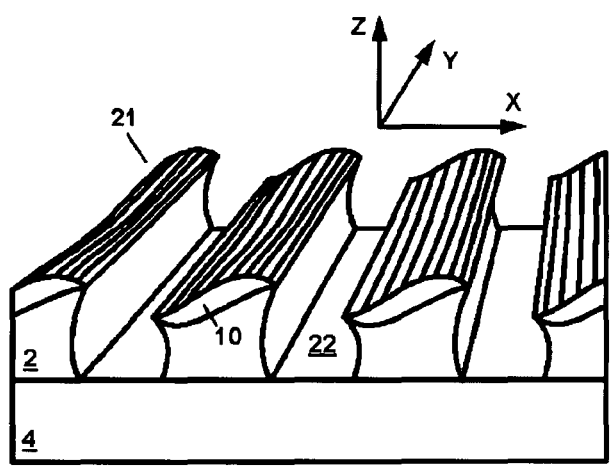
FIG. 2B is a perspective view of elongated ridge elements formed in amorphous silicon layer from a conventional WOS hard nanomask by wet etching.

The conventional WOS and nanostructures formed from conventional WOS by etching with the use of regions 10 and 20 as nanomask can be characterized as a quasi-periodic, anisotropic array of elongated ridge elements having a WOS pattern, each ridge element having a wavelike cross-section and oriented substantially in one direction (Y-axis). Examples of patterns of conventional WOS are shown in FIGS. 1A and 2A. Ridge elements may be waves or other features having tilted tops or sidewalls. In the wave nanostructure 1 of FIG. 1B, the ridge elements are waves with regions 10 and 20 on opposite wave slopes. In the nanostructure 21 of FIG. 2B, the ridge elements are stripes covered by tilted regions 10 and spaced by trenches 22. One can see that the ridge elements are elongated and mostly oriented in the direction of Y-axis as shown in FIGS. 1A and 2A.

Figure 4A:
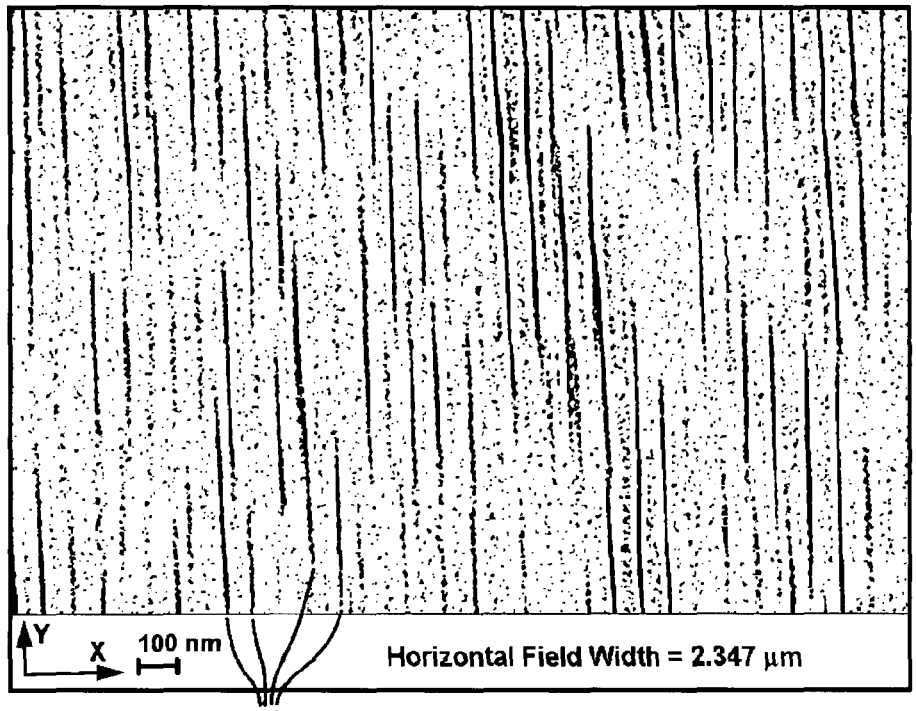
FIG. 4A shows a SEM top view image of a plurality of substantially parallel grooves formed using a conventional WOS hard nanomask by the ion flow, according to the invention.
Figure 4B:
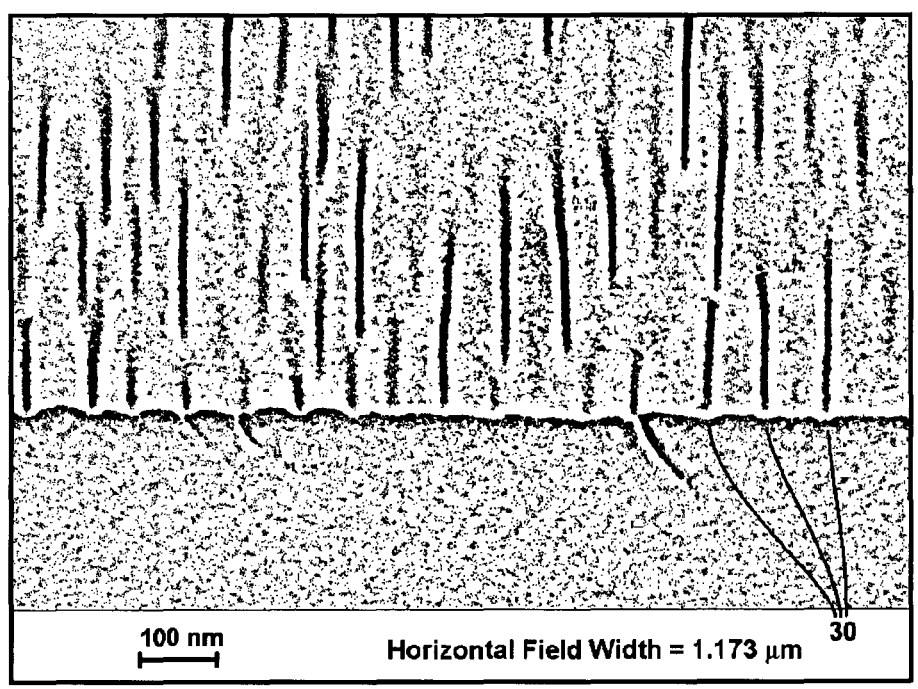
FIG. 4B shows a SEM cross-section view, angled at 70°, of a plurality of substantially parallel grooves formed from a conventional WOS hard nanomask by the ion flow, according to the invention.

Then the structure 311 or 311a is subjected to ion sputtering by a grazing ion flow 32 at the ion incidence plane YZ at angle $\theta_2$ to the surface normal (Z-axis) to generate the structure 312 having a plurality of grooves 30 oriented parallel to the Y-axis. In at least some embodiments, the nitrogen $N_2^+$ ion bombardment is at an angle $\theta_2$ ranging from 70° to 87° or from 75° to 87° and the ion energy is in the range from 1 to 5 keV. In at least some embodiments, $\theta_2$ is set to be in the range from 80°-85°. Ion sputtering results in the thinning of film layer 304 to the thickness $D_2$, which may range from 60-170 nm. In at least some embodiments, the depth of the grooves may be close to their width and to the thickness of regions 10 as shown in the structure 312. The grooves' depth and their length along Y-axis may vary as shown in the structure 312 and FIGS. 4A and 4B. Note that FIGS. 4A and 4B show the grooves formed from a conventional WOS on the surface of monocrystalline silicon wafer by $N_2^+$ ions. A similar arrangement is typical for the grooves formed from a conventional WOS on the surfaces of amorphous silicon layers by $N_2^+$ ions. The surface of the layer 304 between the grooves 30 may be substantially planar as shown in the structure 312 or may have a low-amplitude wavy shape as shown in FIG. 4B. The periodicity of the grooves generated from conventional WOS can be determined by the average period of the conventional WOS.

In at least some embodiments, different ion species can be used along with $N_2^+$ ions to form the WOS and to generate elongated grooves from the WOS. For example, $N^+$, $NO^+$, $NH_m^+$, $O_2^+$, $Ar^+$, $Kr^+$, $Xe^+$, or a mixture of $Ar^+$ and $N_2^+$ can be used. In one embodiment, the WOS can be formed by $N_2^+$ ions and the elongated grooves can be formed by $Ar^+$ ions.

In at least some embodiments, the composition of regions 10 and 20 of the WOS formed by a first ion irradiation of a material with the first ions can be changed by a second ion irradiation during a short period of time, if the ion incidence planes for the first and the second ion irradiations substantially coincide. For example, a WOS on silicon having regions 10 and 20 of silicon oxide formed from silicon by oxygen ions can be transformed by nitrogen ion flow into a WOS on silicon having regions 10 and 20 of silicon nitride. The sputtering depth for such a transformation may be approximately equal to the thickness of the relatively thick regions 10.

After the preliminary formation of elongated grooves a coherent hard nanomask is formed by modifying the surface layer using ion bombardment. For example, referring to FIG. 3, In at least some embodiments, in this step, the surface of layer 304 is irradiated by a substantially homogeneous flow 31 of nitrogen $N_2^+$ ions in the ion incidence plane XZ to form the coherent hard nanomask 300 in structure 313. The ion irradiation is performed in the ion incidence plane XZ, which is substantially perpendicular to the direction of the preliminary generated grooves (Y-axis). In one example, to achieve a nanomask wavelength approximately equal to 90 nm the ion bombardment angle $\theta_3$ is approximately equal to 53° and the ion energy is approximately equal to 5 keV. The formation depth of the coherent hard nanomask may be approximately equal to the height of regions 10 (the distance along Z-axis between the lowest and highest portions of regions 10), which is about 30 nm for 90-nm period. As shown in the structure 313, the wave troughs are spaced from the surface of the film layer 304 by a distance $D_3$, which may range from 20 to 60 nm.

As is schematically illustrated on FIG. 3, the coherent hard nanomask 300 is a substantially periodic array of hard wavelike asymmetrical nanostructures. These structures are comprised of relatively thick 2-15 nm silicon nitride region 10 on the front (the side facing the ion flow) followed by a relatively thin 0.2-1.5 nm silicon nitride region 20 on the back (with respect to ion flow 31) side covering the layer of amorphous silicon 304. The thickness of the region is defined as an average thickness of the layer measured along a local normal to the surface of the wavelike structure. This periodic array of hard wavelike structures is an array of substantially parallel elongated elements with a length that is much larger than its breadth. In at least some embodiments, the wave crests of the nanomask 300 are formed at right angles to the ion bombardment plane, coinciding with the XZ plane of the structure 313 in FIG. 3, and parallel to the direction of the prior generated grooves, i.e. the direction of Y-axis. Since the thickness of the silicon nitride on the front side (regions 10) is much larger then on the back side (regions 20) and since the silicon nitride is hard and durable, this nanomask is particularly suited for transferring patterns into the underlying layers using anisotropic etching techniques.

Figure 5A:
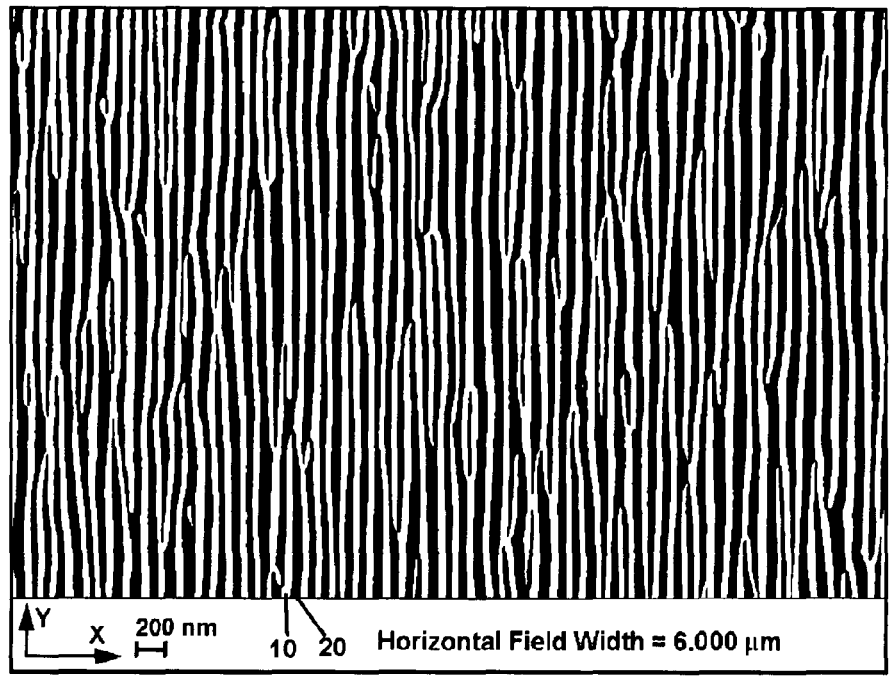
FIG. 5A shows a SEM top view image of a coherent hard nanomask formed on the surface of amorphous silicon layer, according to the invention.

FIG. 5A shows a coherent hard nanomask formed on the surface of amorphous silicon layer (a-Si) in the structure a-Si(426 nm)/Al(139 nm)/thermal $SiO_2$ (540 nm)/Si, which was fabricated on silicon wafer with the layer of thermal $SiO_2$ by sequential deposition of aluminum and amorphous silicon. The process flow to generate the coherent hard nanomask includes the following steps. The first step was a formation of a conventional WOS by sputtering of the a-Si layer with a nitrogen $N_2^+$ ion beam having energy of about 5 keV and an angle of bombardment $\theta_1$ of about 53°. The ion sputtering depth for the first step was approximately 110 nm. The average period of the conventional WOS was about 85 nm. At the second step, the elongated grooves were generated from the conventional WOS using a nitrogen $N_2^+$ ion beam having energy of about 5 keV and an angle of bombardment $\theta_2$ of about 85° at an ion incidence plane substantially parallel to the wave crests of the conventional WOS. The ion sputtering depth for the second step was approximately 80 nm. At the third step, the coherent hard nanomask was formed by sputtering the surface of the amorphous silicon with the elongated grooves using a nitrogen $N_2^+$ ion beam having energy of about 5 keV and an angle of bombardment $\theta_3$ of about 53° at the ion incidence plane substantially perpendicular to the elongation of the previously generated grooves. The ion sputtering depth for the third step was approximately 40 nm. The average period of the coherent hard nanomask was about 96 nm, which was 11 nm larger than that of the conventional WOS formed at the first step. It will be understood that the process conditions can be modified to form a coherent hard nanomask with different average periods (wavelengths) in the range from, for example, 20 to 150 nm. The period of the coherent hard nanomask is mainly determined by the wavelength of the conventional WOS, which can depend on the ion energy and the angle of ion incidence. Note that the average period of the coherent hard nanomask may be a bit larger than that of the conventional WOS as shown above.

Figure 5B:
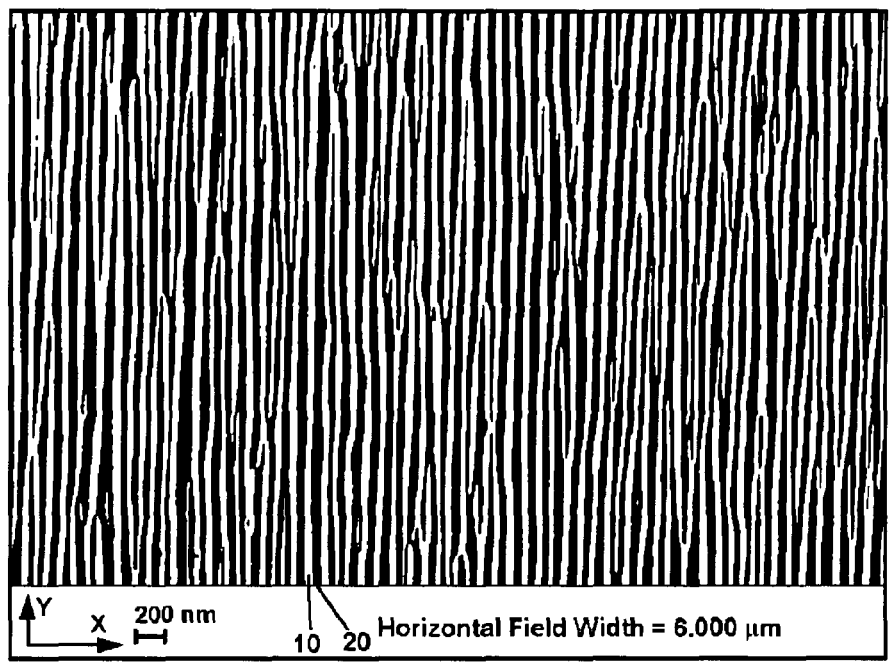
FIG. 5B shows a SEM top view image of a coherent hard nanomask formed on the surface of monocrystalline silicon, according to the invention.

FIG. 5B shows a coherent hard nanomask formed on the surface of monocrystalline silicon. The process flow to generate the coherent hard nanomask includes the following steps. The first step was a formation of a conventional WOS by sputtering of monocrystalline silicon with a nitrogen $N_2^+$ ion beam having energy of about 5 keV and an angle of bombardment $\theta_1$ of about 53°. The ion sputtering depth for the first step was approximately 120 nm. The average period of the conventional WOS was about 70 nm. At the second step, the conventional wave-ordered structure was wet etched for approximately 16 seconds in a solution (65% HNO3):(49% HF)=250:1 v/v to make a structure similar to the top of the structure 311a in the layer 304 of FIG. 3. At the third step, elongated grooves were generated from the wet-etched conventional WOS using a nitrogen $N_2^+$ ion beam having energy of about 5 keV and an angle of bombardment $\theta_2$ of about 85° at the ion incidence plane substantially parallel to the wave crests of the conventional WOS. The ion sputtering depth for the second step was approximately 120 nm. At the fourth step, the coherent hard nanomask was formed by sputtering the surface of monocrystalline silicon with the elongated grooves using a nitrogen $N_2^+$ ion beam having energy of about 5 keV and an angle of bombardment $\theta_3$ of about 53° at the ion incidence plane substantially perpendicular to the elongation of the previously generated grooves. The ion sputtering depth for the third step was approximately 50 nm. The average period of the coherent hard nanomask was about 90 nm, which is 20 nm larger than that of the conventional WOS formed at the first step. It will be understood that the process conditions can be modified to form a coherent hard nanomask with different average periods (wavelengths) in the range from, for example, 20 to 150 nm. The period of the coherent hard nanomask is mainly determined by the wavelength of the conventional WOS, which can depend on the ion energy and the angle of ion incidence. Note that the average period of the coherent hard nanomask may be larger than that of conventional WOS as shown above and this period enlargement may have a systematic nature.

In at least some embodiments, the nanomask 300 in the structure 313 may also be generated from 70-nm-pitch low-amplitude topographic waves produced by oriented polishing along the Y-axis. In this embodiment, the surface of layer 304 is irradiated by a substantially homogeneous ion flow 31 of nitrogen $N_2^+$ ions. As an example, to achieve a nanostructure wavelength approximately equal to 70 nm the nitrogen ion bombardment angle $\theta_3$ is approximately equal to 52° and the ion energy is approximately equal to 4 keV. The nanostructure formation depth is approximately equal to 20-40 nm. The ion irradiation is performed in the ion incidence plane XZ which is perpendicular to the direction of the preliminary oriented polishing.

While the described above preferred embodiments illustrate the formation of the nanomask by the modification of monocrystalline silicon or an amorphous silicon layer by oblique sputtering with nitrogen ions, similar results can be obtained using different materials (for example, nanocrystalline silicon, polycrystalline silicon, crystalline gallium arsenide etc.) and different ions (for example, $N_2^+$, $N^+$, $NO^+$, $NH_m^+$, $O_2^+$, $Ar^+$, $Kr^+$, $Xe^+$, and a mixture of $Ar^+$ and $N_2^+$).

Referring again to FIG. 3, after the nanomask 300 is formed, the structure 313 is modified by applying a reactive-ion plasma ($Cl_2$, $Cl_2$—Ar, HBr—$O_2$ or $Cl_2$—He—$O_2$ or by any other method known in art) to the amorphous silicon layer 304, using the original nanomask 300. In at least some embodiments, the process results in a modified nanomask having silicon nitride regions 10a formed on top of 20-60 nm stripes of amorphous silicon 304, as shown in the structure 314 of FIG. 3. The thickness of regions 10a may become thinner than the thickness of original regions 10 during plasma etching.

In the next step anisotropic etching is applied to the metal layer 302. If the metal layer is an aluminum layer, a $BCl_3$—$CCl_4$, $BCl_3$—$Cl_2$—$O_2$, $BCl_3$—$Cl_2$—$N_2$, HBr—$Cl_2$—He—$O_2$ or HBr—$BCl_3$—$N_2$ mixture can be used, for example. The resulting structure 315 may include metal stripes 302 with the remnants of amorphous silicon 304 on top. In the structure 316, the remnants of the amorphous silicon mask can be removed using plasma such as $SF_6$—$O_2$.

Depending on the chosen thickness of the modified layer 20 on the back side of waves of the wavelike nanostructure, a preliminary breakthrough etching step might be performed using argon ion sputtering or sputtering by ions of etching plasma for a relatively short period of time to remove the modified layer 20 from the back side. To remove regions 20 one can also perform wet etching in $HNO_3$—HF solution for a short period of time.

Depending on the properties of the interface between the layer 304 where the nanomask is formed and the underlying target layer 302, an additional breakthrough etching step might be used to transfer the pattern through the interface. For certain combination of materials, both layers could be successfully etched in the same plasma.

In at least some embodiments, an intermediate layer may be positioned between the layer where the nanomask is formed and the underlying target layer. For example, a 20-nm-thick layer of silicon oxide can be located between amorphous silicon layer and aluminum layer. In these embodiments, after the anisotropic etching of amorphous silicon layer through the hard nanomask, the intermediate layer of silicon oxide can be etched, for example, in $CF_4$—$H_2$, $CHF_3$, $C_4F_6$—Ar or $C_4F_8$—Ar based plasma using amorphous silicon as a mask. Then the aluminum layer can be etched and the remnants of amorphous silicon can be removed as described above. In at least some embodiments, an additional breakthrough etching step might be performed using sputtering by argon ions or ions from etching plasma before the main etching of the aluminum layer to remove aluminum oxide.

The invention can be used, for example, for forming nanowire arrays for nanoelectronics and optoelectronics devices.

What is claimed as new and desired to be protected by Letters Patent of the United States is:

1. A hard nanomask, comprising:
   a substantially periodic array of substantially parallel, elongated elements having a wavelike cross-section and being oriented along a first direction, at least some of the elements having the following structure in cross-section:
   an inner region of first material, and
   a first outer region of a second material covering a first portion of the inner region, wherein the second material is formed by modifying the first material using a second ion flow;
   wherein the substantially parallel, elongated elements having the wavelike cross-section are formed from a plurality of grooves formed in the first material by irradiating the grooves with the second ion flow, wherein the grooves are formed using a first ion flow and are oriented substantially parallel along the first direction and wherein a plane of incidence of the second ion flow is substantially perpendicular to the first direction.

2. The nanomask of claim 1, wherein a wavelength of the substantially periodic array is in a range from 20 to 150 nm.

3. The nanomask of claim 1, wherein the first material is silicon, amorphous silicon, silicon oxide, gallium arsenide, epitaxial gallium arsenide, gallium aluminum arsenide, epitaxial gallium aluminum arsenide, germanium, or silicon-germanium.

4. The nanomask of claim 1, wherein a thickness of the first outer region is at least 2 nm.

5. The nanomask of claim 1, further comprising a second outer region of the second material covering a second portion of the inner region connected to the first outer region at a wave crest, wherein the first outer region is substantially thicker than the second outer region.

6. The nanomask of claim 5, wherein a thickness of the second outer region is no more than 1.5 nm.

7. The nanomask of claim 5, wherein the second material is silicon nitride, silicon-germanium nitride, silicon oxide, gallium nitride, gallium oxide, aluminum nitride, aluminum oxide, gallium aluminum nitride, or gallium aluminum oxide.

8. The nanomask of claim 5, wherein the second ion flow is a flow of $N_2^+$, $N^+$, $NO^+$, $NH_m^+$, $O_2^+$, $Ar^+$, $Kr^+$, $Xe^+$, or a mixture of $Ar^+$ and $N_2^+$.

9. The nanomask of claim 1, wherein the plurality of grooves is formed by polishing the surface of the first material in the first direction prior to the first ion flow.

10. The nanomask of claim 9, wherein the polishing is performed using a slurry comprising particles chosen from alumina particles, silica particles, chromium oxide particles, or any combination thereof.

11. The nanomask of claim 9, wherein the polishing is performed using a water- or toluene-based slurry comprising alumina, silica, or chromium oxide particles or any combination thereof.

12. The nanomask of claim 9, wherein the polishing is performed using a slurry comprising small particles, wherein an average particle size of the small particles is not greater than a value approximately equal to a wavelength of the substantially periodic array.

13. The nanomask of claim 1, wherein the plurality of grooves is formed from a quasi-periodic, anisotropic array of elongated ridge elements having a wave-ordered structure pattern, each ridge element having a wavelike cross-section and oriented substantially in the first direction, by irradiating the array of elongated ridge elements with the first ion flow, wherein a plane of ion incidence of the first ion flow is substantially parallel to the first direction.

14. The nanomask of claim 13, wherein the plurality of grooves is formed with an angle of incidence of the first ion flow being in a range from 70 to 87 degrees with respect to the surface normal of the first material.

15. A method of forming a hard nanomask for transferring a substantially periodic pattern into a thin film, the method comprising:

depositing a first material to form a surface layer on top of a surface of a thin film;

forming a plurality of grooves on a surface of the surface layer using a first ion flow, wherein the grooves are oriented substantially parallel along a first direction; and irradiating the surface of the surface layer with the plurality of grooves with a second ion flow oriented substantially parallel along the first direction until a hard nanomask is formed, the nanomask comprising a substantially periodic array of substantially parallel elongated elements having a wavelike cross-section, at least some of the elements having the following structure in cross-section: an inner region of first material, a first outer region of a second material covering a first portion of the inner region, and a second outer region of the second material covering a second portion of the inner region and connecting with the first outer region at a wave crest, wherein the first outer region is substantially thicker than the second outer region, and wherein the second material is formed by modifying the first material by the second ion flow, wherein a plane of incidence of the second ion flow is substantially perpendicular to the first direction.

16. The method of claim 15, wherein a wavelength of the substantially periodic array is in a range from 20 to 150 nm.

17. The method of claim 15, wherein the first material is silicon, amorphous silicon, silicon oxide, gallium arsenide, epitaxial gallium arsenide, gallium aluminum arsenide, epitaxial gallium aluminum arsenide, germanium, or silicon-germanium.

18. The method of claim 15, wherein the second ion flow comprises a flow of $N_2^+$, $N^+$, $NO^+$, $NH_m^+$, $O_2^+$, $Ar^+$, $Kr^+$, $Xe^+$, or a mixture of $Ar^+$ and $N_2^+$ ions.

19. The method of claim 15, wherein a thickness of the first outer region is at least 4 nm.

20. The method of claim 15, wherein a thickness of the second outer region is no more than 2 nm.

21. The method of claim 15, wherein the second material is silicon nitride, silicon-germanium nitride, silicon oxide, gallium nitride, gallium oxide, aluminum nitride, aluminum oxide, gallium aluminum nitride, or gallium aluminum oxide.

22. The method of claim 15, wherein forming a plurality of grooves on the surface of the surface layer comprises:

forming a quasi-periodic, anisotropic array of elongated ridge elements having a wave-ordered structure pattern, each ridge element having a wavelike cross-section and oriented substantially in the first direction; and irradiating the array of elongated ridge elements with the first ion flow until the plurality of grooves is formed on the surface of the surface layer, wherein a plane of incidence of the first ion flow is substantially parallel to the first direction.

23. The method of claim 22, wherein an angle of incidence of the first ion flow is in a range from 70 to 87 degrees with respect to a surface layer normal.

24. The method of claim 15, wherein forming a plurality of grooves further comprises polishing the surface of the surface layer in the first direction.

25. The method of claim 24, wherein the polishing is performed using a slurry comprising particles chosen from a group consisting of alumina particles, silica particles, chromium oxide particles, or any combination thereof.

26. The method of claim 24, wherein the polishing is performed using a water- or toluene-based slurry comprising alumina, silica, or chromium oxide particles or any combination thereof.

27. The method of claim 24, wherein the polishing is performed using a slurry comprising small particles, wherein an average particle size of the small particles is not greater than a value approximately equal to a wavelength of the substantially periodic array.

* * * * *